(12) United States Patent
Lochtefeld et al.

(10) Patent No.: US 7,615,829 B2
(45) Date of Patent: Nov. 10, 2009

(54) ELEVATED SOURCE AND DRAIN ELEMENTS FOR STRAINED-CHANNEL HETEROJUNTION FIELD-EFFECT TRANSISTORS

(75) Inventors: Anthony J. Lochtefeld, Somerville, MA (US); Thomas A. Langdo, Cambridge, MA (US); Richard Westhoff, Hudson, NH (US)

(73) Assignee: AmberWave Systems Corporation, Salem, NH (US)

( * ) Notice: Subject to any disclaimer, the term of this patent is extended or adjusted under 35 U.S.C. 154(b) by 67 days.

(21) Appl. No.: 10/164,988

(22) Filed: Jun. 7, 2002

(65) Prior Publication Data

US 2003/0227029 A1 Dec. 11, 2003

(51) Int. Cl.
*H01L 27/088* (2006.01)
*H01L 29/45* (2006.01)
(52) U.S. Cl. ............... 257/377; 257/384; 257/E29.268
(58) Field of Classification Search ............ 257/64–66, 257/382–384, 377, E29.268; 438/300
See application file for complete search history.

(56) References Cited

U.S. PATENT DOCUMENTS

| | | | |
|---|---|---|---|
| 4,010,045 A | 3/1977 | Ruehrwein | |
| 4,710,788 A | 12/1987 | Dambkes et al. | |
| 4,717,681 A | 1/1988 | Curran | |
| 4,755,478 A | 7/1988 | Abernathey et al. | |
| 4,803,539 A | 2/1989 | Psaras et al. | |
| 4,969,031 A | 11/1990 | Kobayashi et al. | |
| 4,987,462 A | 1/1991 | Kim et al. | |
| 4,990,979 A | 2/1991 | Otto | |
| 4,997,776 A | 3/1991 | Harame et al. | |
| 5,013,681 A | 5/1991 | Godbey et al. | |
| 5,034,348 A | 7/1991 | Hartswick et al. | |
| 5,089,872 A * | 2/1992 | Ozturk et al. ............... 257/382 |
| 5,155,571 A | 10/1992 | Wang et al. | |
| 5,166,084 A | 11/1992 | Pfiester | |
| 5,177,583 A | 1/1993 | Endo et al. | |
| 5,198,689 A | 3/1993 | Fujioka | |
| 5,202,284 A | 4/1993 | Kamins et al. | |
| 5,207,864 A | 5/1993 | Bhat et al. | |
| 5,208,182 A | 5/1993 | Narayan et al. | |
| 5,212,110 A | 5/1993 | Pfiester et al. | |
| 5,217,923 A | 6/1993 | Suguro | |

(Continued)

FOREIGN PATENT DOCUMENTS

DE 41 01 167 A1 7/1992

(Continued)

OTHER PUBLICATIONS

Meyer, Douglas, Elevated Source/Drain Structures, Spring 1998, The ASM Epitaxy Newsletter of Continuous Improvement, 1-3.*

(Continued)

*Primary Examiner*—Anh D Mai
(74) *Attorney, Agent, or Firm*—Goodwin Procter LLP

(57) ABSTRACT

A semiconductor structure having a surface layer disposed over a substrate, the surface layer including strained silicon. A contact layer is disposed over a portion of the surface layer, the contact layer including a metal-semiconductor alloy. A bottommost boundary of the contact layer is disposed above a bottommost boundary of the surface layer.

1 Claim, 7 Drawing Sheets

U.S. PATENT DOCUMENTS

| | | |
|---|---|---|
| 5,221,413 A | 6/1993 | Brasen et al. |
| 5,240,876 A | 8/1993 | Gaul et al. |
| 5,241,197 A | 8/1993 | Murakami et al. |
| 5,242,847 A | 9/1993 | Ozturk et al. |
| 5,250,445 A | 10/1993 | Bean et al. |
| 5,285,086 A | 2/1994 | Fitzgerald |
| 5,291,439 A | 3/1994 | Kauffmann et al. |
| 5,298,452 A | 3/1994 | Meyerson |
| 5,310,451 A | 5/1994 | Tejwani et al. |
| 5,316,958 A | 5/1994 | Meyerson |
| 5,334,861 A | 8/1994 | Pfiester et al. |
| 5,336,903 A | 8/1994 | Ozturk et al. |
| 5,346,840 A | 9/1994 | Fujioka |
| 5,346,848 A | 9/1994 | Grupen-Shemansky |
| 5,374,564 A | 12/1994 | Bruel |
| 5,399,522 A | 3/1995 | Ohori |
| 5,413,679 A | 5/1995 | Godbey |
| 5,424,243 A | 6/1995 | Takasaki |
| 5,426,069 A | 6/1995 | Selvakumar et al. |
| 5,426,316 A | 6/1995 | Mohammad |
| 5,442,205 A | 8/1995 | Brasen et al. |
| 5,461,243 A | 10/1995 | Ek et al. |
| 5,461,250 A | 10/1995 | Burghartz et al. |
| 5,462,883 A | 10/1995 | Dennard et al. |
| 5,476,813 A | 12/1995 | Naruse |
| 5,479,033 A | 12/1995 | Baca et al. |
| 5,484,664 A | 1/1996 | Kitaahara et al. |
| 5,496,750 A | 3/1996 | Moslehi |
| 5,496,771 A | 3/1996 | Cronin et al. |
| 5,523,243 A | 6/1996 | Mohammad |
| 5,523,592 A | 6/1996 | Nakagawa et al. |
| 5,534,713 A | 7/1996 | Ismail et al. |
| 5,536,361 A | 7/1996 | Kondo et al. |
| 5,540,785 A | 7/1996 | Dennard et al. |
| 5,572,043 A | 11/1996 | Shimizu et al. |
| 5,596,527 A | 1/1997 | Tomioka et al. |
| 5,617,351 A | 4/1997 | Bertin et al. |
| 5,630,905 A | 5/1997 | Lynch et al. |
| 5,659,187 A | 8/1997 | Legoues et al. |
| 5,659,194 A | 8/1997 | Iwamatsu et al. |
| 5,683,934 A | 11/1997 | Candelaria |
| 5,698,869 A | 12/1997 | Yoshimi et al. |
| 5,714,777 A | 2/1998 | Ismail et al. |
| 5,728,623 A | 3/1998 | Mori |
| 5,739,567 A | 4/1998 | Wong |
| 5,759,898 A | 6/1998 | Ek et al. |
| 5,777,347 A | 7/1998 | Bartelink |
| 5,786,612 A | 7/1998 | Otani et al. |
| 5,786,614 A | 7/1998 | Chuang et al. |
| 5,792,679 A | 8/1998 | Nakato |
| 5,808,344 A | 9/1998 | Ismail et al. |
| 5,844,260 A | 12/1998 | Ohori |
| 5,847,419 A | 12/1998 | Imai et al. |
| 5,869,359 A | 2/1999 | Prabhakar |
| 5,877,070 A | 3/1999 | Goesele et al. |
| 5,877,535 A | 3/1999 | Matsumoto |
| 5,891,769 A | 4/1999 | Liaw et al. |
| 5,906,708 A | 5/1999 | Robinson et al. |
| 5,906,951 A | 5/1999 | Chu et al. |
| 5,912,479 A | 6/1999 | Mori et al. |
| 5,933,741 A | 8/1999 | Tseng |
| 5,943,560 A | 8/1999 | Chang et al. |
| 5,963,817 A | 10/1999 | Chu et al. |
| 5,966,622 A | 10/1999 | Levine et al. |
| 5,998,807 A * | 12/1999 | Lustig et al. ............. 257/66 |
| 6,008,111 A | 12/1999 | Fushida et al. |
| 6,013,134 A | 1/2000 | Chu et al. |
| 6,033,974 A | 3/2000 | Henley et al. |
| 6,033,995 A | 3/2000 | Muller |
| 6,058,044 A | 5/2000 | Sugiura et al. |
| 6,059,895 A | 5/2000 | Chu et al. |
| 6,066,563 A | 5/2000 | Nagashima |
| 6,074,919 A | 6/2000 | Gardner et al. |
| 6,096,590 A | 8/2000 | Chan et al. |
| 6,096,647 A | 8/2000 | Yang et al. |
| 6,103,559 A | 8/2000 | Gardner et al. |
| 6,107,653 A | 8/2000 | Fitzgerald |
| 6,111,267 A | 8/2000 | Fischer et al. |
| 6,117,750 A | 9/2000 | Bensahel et al. |
| 6,121,100 A | 9/2000 | Andideh et al. |
| 6,130,453 A | 10/2000 | Mei et al. |
| 6,132,806 A | 10/2000 | Dutartre |
| 6,133,124 A | 10/2000 | Horstmann et al. |
| 6,133,799 A | 10/2000 | Favors et al. |
| 6,140,687 A | 10/2000 | Shimomura et al. |
| 6,143,636 A | 11/2000 | Forbes et al. |
| 6,153,495 A | 11/2000 | Kub et al. |
| 6,154,475 A | 11/2000 | Soref et al. |
| 6,159,856 A | 12/2000 | Nagano |
| 6,162,688 A | 12/2000 | Gardner et al. |
| 6,184,111 B1 | 2/2001 | Henley et al. |
| 6,187,657 B1 | 2/2001 | Xiang et al. |
| 6,190,976 B1 * | 2/2001 | Shishiguchi et al. ........ 438/299 |
| 6,191,007 B1 | 2/2001 | Matsui et al. |
| 6,191,432 B1 | 2/2001 | Sugiyama et al. |
| 6,194,722 B1 | 2/2001 | Fiorini et al. |
| 6,204,529 B1 | 3/2001 | Lung et al. |
| 6,207,977 B1 | 3/2001 | Augusto |
| 6,210,988 B1 | 4/2001 | Howe et al. |
| 6,214,679 B1 | 4/2001 | Murthy et al. |
| 6,218,677 B1 | 4/2001 | Broekaert |
| 6,228,694 B1 | 5/2001 | Doyle et al. |
| 6,232,138 B1 | 5/2001 | Fitzgerald et al. |
| 6,235,567 B1 | 5/2001 | Huang |
| 6,235,568 B1 | 5/2001 | Murthy et al. |
| 6,235,575 B1 | 5/2001 | Kasai et al. |
| 6,242,324 B1 | 6/2001 | Kub et al. |
| 6,246,077 B1 | 6/2001 | Kobayashi et al. |
| 6,249,022 B1 | 6/2001 | Lin et al. |
| 6,251,755 B1 | 6/2001 | Furukawa et al. |
| 6,251,780 B1 | 6/2001 | Sohn et al. |
| 6,261,929 B1 | 7/2001 | Gehrke et al. |
| 6,266,278 B1 | 7/2001 | Harari et al. |
| 6,268,257 B1 | 7/2001 | Wieczorek et al. |
| 6,271,551 B1 | 8/2001 | Schmitz et al. |
| 6,271,726 B1 | 8/2001 | Fransis et al. |
| 6,281,532 B1 | 8/2001 | Doyle et al. |
| 6,291,321 B1 | 9/2001 | Fitzgerald |
| 6,294,448 B1 | 9/2001 | Chang et al. |
| 6,306,698 B1 | 10/2001 | Wieczorek et al. |
| 6,313,016 B1 | 11/2001 | Kibbel et al. |
| 6,313,486 B1 | 11/2001 | Kencke et al. |
| 6,315,384 B1 | 11/2001 | Ramaswami et al. |
| 6,316,301 B1 | 11/2001 | Kant |
| 6,316,357 B1 | 11/2001 | Lin et al. |
| 6,319,805 B1 | 11/2001 | Iwamatsu et al. |
| 6,323,108 B1 | 11/2001 | Kub et al. |
| 6,326,664 B1 | 12/2001 | Chau et al. |
| 6,329,063 B2 | 12/2001 | Lo et al. |
| 6,335,546 B1 | 1/2002 | Tsuda et al. |
| 6,339,232 B1 | 1/2002 | Takagi |
| 6,350,993 B1 | 2/2002 | Chu et al. |
| 6,352,909 B1 | 3/2002 | Usenko |
| 6,362,071 B1 | 3/2002 | Nguyen et al. |
| 6,368,733 B1 | 4/2002 | Nishinaga |
| 6,372,356 B1 | 4/2002 | Thornton et al. |
| 6,372,593 B1 | 4/2002 | Hattori et al. |
| 6,380,008 B2 | 4/2002 | Kwok et al. |
| 6,399,970 B2 | 6/2002 | Kubo et al. |
| 6,403,975 B1 | 6/2002 | Brunner et al. |
| 6,406,986 B1 | 6/2002 | Yu |
| 6,407,406 B1 | 6/2002 | Tezuka |
| 6,410,371 B1 | 6/2002 | Yu et al. |
| 6,420,937 B1 | 7/2002 | Akatsuka et al. |

| | | |
|---|---|---|
| 6,425,951 B1 | 7/2002 | Chu et al. |
| 6,429,061 B1 | 8/2002 | Rim |
| 6,461,960 B2 | 10/2002 | Lee |
| 6,486,520 B2 | 11/2002 | Okuno et al. |
| 6,498,359 B2 | 12/2002 | Schmidt et al. |
| 6,503,833 B1 | 1/2003 | Ajmera et al. |
| 6,509,587 B2 | 1/2003 | Sugiyama et al. |
| 6,521,041 B2 | 2/2003 | Wu et al. |
| 6,524,935 B1 | 2/2003 | Canaperi et al. |
| 6,555,839 B2 | 4/2003 | Fitzgerald |
| 6,555,880 B2 | 4/2003 | Cabral, Jr. et al. |
| 6,562,703 B1 | 5/2003 | Maa et al. |
| 6,563,152 B2 | 5/2003 | Roberds et al. |
| 6,566,718 B2 | 5/2003 | Wieczorek et al. |
| 6,573,126 B2 | 6/2003 | Cheng et al. |
| 6,573,160 B2 | 6/2003 | Taylor, Jr. et al. |
| 6,583,015 B2 | 6/2003 | Fitzgerald et al. |
| 6,591,321 B1 | 7/2003 | Arimilli et al. |
| 6,593,191 B2 | 7/2003 | Fitzgerald |
| 6,593,641 B1 | 7/2003 | Fitzergald |
| 6,597,016 B1 | 7/2003 | Yuki et al. |
| 6,602,613 B1 | 8/2003 | Fitzgerald |
| 6,603,156 B2 | 8/2003 | Rim |
| 6,605,498 B1 | 8/2003 | Murthy et al. |
| 6,621,131 B2 | 9/2003 | Murthy et al. |
| 6,646,322 B2 | 11/2003 | Fitzgerald |
| 6,649,480 B2 | 11/2003 | Fitzgerald et al. |
| 6,657,223 B1 | 12/2003 | Wang et al. |
| 6,674,150 B2 | 1/2004 | Takagi et al. |
| 6,677,192 B1 | 1/2004 | Fitzgerald |
| 6,682,965 B1 * | 1/2004 | Noguchi et al. ............. 438/199 |
| 6,686,617 B2 | 2/2004 | Agnello et al. |
| 6,699,765 B1 | 3/2004 | Shideler et al. |
| 6,703,144 B2 | 3/2004 | Fitzgerald |
| 6,703,648 B1 | 3/2004 | Xiang et al. |
| 6,703,688 B1 | 3/2004 | Fitzergald |
| 6,709,903 B2 | 3/2004 | Christiansen |
| 6,713,326 B2 | 3/2004 | Cheng et al. |
| 6,723,661 B2 | 4/2004 | Fitzergald |
| 6,724,008 B2 | 4/2004 | Fitzergald |
| 6,724,019 B2 | 4/2004 | Oda et al. |
| 6,730,551 B2 | 5/2004 | Lee et al. |
| 6,737,670 B2 | 5/2004 | Cheng et al. |
| 6,743,684 B2 | 6/2004 | Liu |
| 6,750,130 B1 | 6/2004 | Fitzgerald |
| 6,797,571 B2 | 9/2004 | Nagaoka et al. |
| 6,812,086 B2 | 11/2004 | Murthy et al. |
| 6,828,632 B2 | 12/2004 | Bhattacharyya |
| 6,861,318 B2 | 3/2005 | Murthy et al. |
| 6,885,084 B2 | 4/2005 | Murthy et al. |
| 2001/0001724 A1 | 5/2001 | Kwok et al. |
| 2001/0003364 A1 | 6/2001 | Sugawara et al. |
| 2001/0009303 A1 | 7/2001 | Tang et al. |
| 2001/0031535 A1 | 10/2001 | Agnello et al. |
| 2001/0045604 A1 | 11/2001 | Oda et al. |
| 2002/0001948 A1 * | 1/2002 | Lee ............................. 438/683 |
| 2002/0019127 A1 | 2/2002 | Givens |
| 2002/0024395 A1 | 2/2002 | Akatsuka et al. |
| 2002/0043660 A1 | 4/2002 | Yamazaki et al. |
| 2002/0048910 A1 | 4/2002 | Taylor, Jr. et al. |
| 2002/0052084 A1 | 5/2002 | Fitzgerald |
| 2002/0056879 A1 | 5/2002 | Wieczorek et al. |
| 2002/0063292 A1 | 5/2002 | Armstrong et al. |
| 2002/0068393 A1 | 6/2002 | Fitzgerald et al. |
| 2002/0084000 A1 | 7/2002 | Fitzgerald |
| 2002/0096717 A1 | 7/2002 | Chu et al. |
| 2002/0100942 A1 | 8/2002 | Fitzgerald et al. |
| 2002/0123167 A1 | 9/2002 | Fitzgerald |
| 2002/0123183 A1 | 9/2002 | Fitzgerald |
| 2002/0125471 A1 | 9/2002 | Fitzgerald et al. |
| 2002/0140031 A1 | 10/2002 | Rim |
| 2002/0168864 A1 | 11/2002 | Cheng et al. |
| 2002/0190284 A1 | 12/2002 | Murthy et al. |
| 2003/0003679 A1 | 1/2003 | Doyle et al. |
| 2003/0013323 A1 | 1/2003 | Hammond et al. |
| 2003/0034529 A1 | 2/2003 | Fitzgerald et al. |
| 2003/0057439 A1 | 3/2003 | Fitzgerald |
| 2003/0102498 A1 | 6/2003 | Braithwaite et al. |
| 2003/0113971 A1 | 6/2003 | Nagaoka et al. |
| 2003/0199126 A1 | 10/2003 | Chu et al. |
| 2003/0203600 A1 | 10/2003 | Chu et al. |
| 2003/0215990 A1 | 11/2003 | Fitzgerald et al. |
| 2003/0218189 A1 | 11/2003 | Christiansen |
| 2003/0227057 A1 | 12/2003 | Lochtefeld et al. |
| 2004/0005740 A1 | 1/2004 | Lochtefeld et al. |
| 2004/0007724 A1 | 1/2004 | Murthy et al. |
| 2004/0014276 A1 | 1/2004 | Murthy et al. |
| 2004/0014304 A1 | 1/2004 | Bhattacharyya |
| 2004/0031979 A1 | 2/2004 | Lochtefeld |
| 2004/0041210 A1 | 3/2004 | Mouli |
| 2004/0070035 A1 | 4/2004 | Murthy et al. |
| 2004/0075149 A1 | 4/2004 | Fitzgerald et al. |
| 2004/0084735 A1 | 5/2004 | Murthy et al. |
| 2004/0119101 A1 | 6/2004 | Schrom et al. |
| 2004/0142545 A1 | 7/2004 | Ngo et al. |
| 2004/0173815 A1 | 9/2004 | Yeo et al. |

FOREIGN PATENT DOCUMENTS

| | | |
|---|---|---|
| EP | 0 514 018 A2 | 11/1992 |
| EP | 0 587 520 B1 | 3/1994 |
| EP | 0 683 522 A2 | 11/1995 |
| EP | 0 828 296 A2 | 3/1998 |
| EP | 0 829 908 A2 | 3/1998 |
| EP | 0 838 858 B1 | 4/1998 |
| EP | 1 020 900 A2 | 7/2000 |
| EP | 1 174 928 A1 | 1/2002 |
| FR | 2 701 599 | 9/1993 |
| GB | 2 342 777 A | 4/2000 |
| JP | 61/141116 | 6/1986 |
| JP | 2/210816 | 8/1990 |
| JP | 30-36717 | 2/1991 |
| JP | 40-307974 | 10/1992 |
| JP | 5-166724 | 7/1993 |
| JP | 6-177046 | 6/1994 |
| JP | 06-244112 | 9/1994 |
| JP | 6-252046 | 9/1994 |
| JP | 7-94420 | 4/1995 |
| JP | 07-106446 | 4/1995 |
| JP | 7-240372 | 9/1995 |
| JP | 10-270685 | 10/1998 |
| JP | 11-233744 | 8/1999 |
| JP | 2000-021783 | 1/2000 |
| JP | 2000-031491 A | 1/2000 |
| JP | 2001-319935 | 11/2001 |
| JP | 2002-076334 | 3/2002 |
| JP | 2002-164520 | 6/2002 |
| JP | 2002-289533 | 10/2002 |
| JP | 2002-324765 | 11/2002 |
| WO | 98/59365 | 12/1998 |
| WO | 99/53539 | 10/1999 |
| WO | 00/48239 | 8/2000 |
| WO | 00/54338 | 9/2000 |
| WO | WO01/22482 | 3/2001 |
| WO | 01/54202 A1 | 7/2001 |
| WO | WO 01/54202 | 7/2001 |
| WO | 01/93338 A1 | 12/2001 |
| WO | 01/99169 A2 | 12/2001 |
| WO | 02/13262 A2 | 2/2002 |
| WO | 02/15244 A2 | 2/2002 |
| WO | 02/27783 A1 | 4/2002 |
| WO | 02/47168 A2 | 6/2002 |
| WO | WO 02/47168 | 6/2002 |
| WO | 02/071488 A1 | 9/2002 |
| WO | 02/071491 A1 | 9/2002 |
| WO | 02/071495 A1 | 9/2002 |

| | | |
|---|---|---|
| WO | 02/082514 A1 | 10/2002 |
| WO | 2004/006311 A2 | 1/2004 |
| WO | 2004/006327 A2 | 1/2004 |

OTHER PUBLICATIONS

Augendre, Emmanuel, Elevated Source/Drain by Sacrificial Selective Epitaxy fo rHigh Performance Deep Submicron CMOS: Process Window versus Complexity, Jul. 2000, IEEE Transactins on Electron Devices, vol. 47, No. 7, 1484-1491.*
Wong et al., "Elevated Source/Drain MOSFET," *IEDM Technical Digest* (1984) pp. 634-637.
Lynch, "Self-Aligned Contact Schemes for Source-Drains in Submicron Devices," *IEDM Technical Digest* (1987) pp. 354-357.
Shibata et al., "High Performance Half-Micron PMOSFETs with 0.1UM Shallow P$^+$N Junction Utilizing Selective Silicon Growth and Rapid Thermal Annealing," *IEDM Technical Digest* (1987) pp. 590-593.
Ilderem et al, "Very low pressure chemical vapor deposition process for selective titanium silicide films," *Appl. Phys. Lett.*, vol. 53, No. 8 (Aug. 22, 1988) pp. 687-689.
Reynolds et al., "Selective titanium disilicide by low-pressure chemical vapor deposition," *J. Appl. Phys.*, vol. 65, No. 8 (Apr. 15, 1989) pp. 3212-3218.
Mercier et al., "Selective TiSi$_2$ Deposition with no Silicon Substrate Consumption by Rapid Thermal Processing in a LPCVD Reactor," *Journal of Electronic Materials*, vol. 19, No. 3 (1990) pp. 253-258.
Öztürk et al., "Rapid Thermal Chemical Vapor Deposition of Germanium and Germanium/Silicon Alloys on Silicon: New Applications in the Fabrication of MOS Transistors," *Mat. Res. Soc. Symp. Proc.*, vol. 224 (1991) pp. 223-234.
Ren et al., "A Novel Implantation Free Raised Source/Drain MOSFET Process Using Selective Rapid Thermal Chemical Vapor Deposition of In-Situ Boron Doped Si$_x$Ge$_{1-x}$," *Mat. Res. Soc. Symp. Proc.*, vol. 303 (1993) pp. 37-41.
Sidek et al., "Reduction of parasitic bipolar transistor action and punchthrough susceptibility in MOSFETs using Si/ Si$_{1-x}$Ge$_x$ sources and drains," *Electronic Letters*, vol. 32, No. 3 (Feb. 1, 1996) pp. 269-270.
Chieh et al., "Low-Resistance Bandgap-Engineered W/Si$_{1-x}$Ge$_x$/Si Contacts," *IEEE Electron Device Letters*, vol. 17, No. 7 (Jul. 1996) pp. 360-362.
Choi et al., "30nm ultra-thin body SOI MOSFET with selectively deposited Ge raised S/D," *58$^{th}$ Device Research Conference* (2000) pp. 23-24.
Choi et al., "Nanoscale Ultrathin Body PMOSFETs with Raised Selective Germanium Source/Drain," *IEEE Electron Device Letters*, vol. 22, No. 9 (Sep. 2001) pp. 447-448.
Uchino et al., "MOSFETs with Utrashallow Junction and Minimum Drain Area Formed by Using Solid-Phase Diffusion from SiGe," *IEEE Transactions on Electron Devices*, vol. 48, No. 7 (Jul. 2001) pp. 1406-1411.
Glück et al., "CoSi$_2$ and TiSi$_2$ for Si/SiGe heterodevices," *Thin Solid Films*, vol. 270 (1995) pp. 549-554.
Maiti et al., "Strained-Si heterostructure field effect transistors," *Semicond. Sci. Technol.*, vol. 13 (1998) pp. 1225-1246.
Maillard-Schaller et al., "Role of the substrate strain in the sheet resistance stability of NiSi deposited on Si(100)," *Journal of Applied Physics*, vol. 85, No. 7 (Apr. 1, 1999) pp. 3614-3618.
Huang et al., "Electrical and Compositional Properties of Co-Silicided Shallow P$^+$-n. Junction Using Si-Capped/Boron-Doped Si$_{1-x}$Ge$_x$ Layer Deposited by UHVCME," *Journal of the Electrochemical Society*, vol. 148, No. 3 (2001) pp. G126-C131.
International Search Report for PCT/US03/17754, dated Oct. 10, 2003.
Antoniadis et al., "SOI Devices and Technology," *SOI devices and technology*, Neuilly sur Seine, France, (1999), pp. 81-87.
Aoyama et al., "Facet formation mechanism of silicon selective epitaxial layer by Si ultrahigh vacuum chemical vapor deposition," *Journal of Crystal Growth*, 136 (1994), pp. 349-354.
Arst et al., "Surface planarity and microstructure of low temperature silicon SEG and ELO," *Journal of Materials Research*, vol. 6, No. 4 (Apr. 1991), pp. 784-791.

Cao et al., "0.18-μm Fully-Depleted Silicon-on-Insulator MOSFET's," *IEEE Electron Device Letters*, vol. 18, No. 6 (Jun. 1997), pp. 251-253.
Choi et al., "Nanoscale Ultrathin Body PMOSFETs With Raised Selective Germanium Source/Drain," *IEEE Electron Device Letters*, vol. 22, No. 9 (Sep. 2001), pp. 447-448.
Drowley et al., "Model for facet and sidewall defect formation during selective epitaxial growth of (001) silicon," *Applied Physics Letters*, 52 (7) (Feb. 15, 1988), pp. 546-548.
Eaglesham et al., "Growth Morphology and the Equilibrium Shape: The Role of "Surfactants" in the Ge/Si Island Formation," *Physical Review Letters*, vol. 70, No. 7 (Feb. 15, 1993), pp. 966-969.
Gallas et al., "Influence of doping on facet formation at the SiO2/Si interface," *Surface Science*, 440 (1999), pp. 41-48.
Goulding, "The selective epitaxial growth of silicon," *Materials Science and Engineering*, BI7 (1993), pp. 47-67.
Greve et al., "Growth Rate of Doped and Undoped Silicon by Ultra-High Vacuum Chemical Vapor Deposition," *Journal of the Electrochemical Society*, vol. 138, No. 6 (Jun. 1991), pp. 1744-1748.
Ishitani et al., "Facet Formation in Selective Silicon Epitaxial Growth," *Japanese Journal of Applied Physics*, vol. 24, No. 10 (Oct. 1985), pp. 1267-1269.
Jang et al., "Phosphorus doping of epitaxial Si and Si1-xGex at very low pressure," *Applied Physics Letters*, 63 (12) (Sep. 20, 1993), pp. 1675-1677.
Jastrzebski, "SOI by CVD: Epitaxial Lateral Overgrowth (ELO) Process—Review," *Journal of Crystal Growth*, 63 (1983), pp. 493-526.
Kamins et al., "Kinetics of selective epitaxial deposition of Sil-xGex," *Applied Physics Letters*, 61 (6) (Aug. 10, 1992), pp. 669-671.
Kandel et al., "Surfactant Mediated Crystal Growth of Semiconductors," *Physical Review Letters*, vol. 75, No. 14 (Oct. 2, 1995), pp. 2742-2745.
King, "Silicon-Germanium: from Microelectronics to Micromechanics," Presentation to the Thin Film Users Group Meeting, AVS Northern California Chapter, Apr. 17, 2002.
Kitajima et al., "Lattice Defect in Selective Epitaxial Silicon and Laterally Overgrown Regions on SiO2," *Journal of Crystal Growth*, 98 (1989), pp. 264-276.
Kummer et al., "Low energy plasma enhanced chemical vapor deposition," *Materials Science and Engineering*, B89 (2002), pp. 288-295.
Langdo, "Selective SiGe Nanostructures," Ph.D. Thesis, Massachusetts Institute of Technology, 2001.
Li et al., "Modeling of facet growth on patterned Si substrate in gas source MBE," *Journal of Crystal Growth*, 157 (1995), pp. 185-189.
Lochtefeld, "Toward the End of the MOSFET Roadmap: Investigating Fundamental Transport Limits and Device Architecture Alternatives," Ph.D. Thesis, Massachusetts Institute of Technology, 2001.
Meyerson et al., "Phosphorus-Doped Polycrystalline Silicon via LPCVD," *Journal of the Electrochemical Society*, vol. 131, No. 10 (Oct. 1984), pp. 2366-2368.
Miyano et al., "Facet-Free Si Selective Epitaxial Growth Adaptable to Elevated Source/Drain MOSFETs with Narrow Shallow Trench Isolation," *Japanese Journal of Applied Physics*. vol. 38, Part 1, No. 4B (Apr. 1999), pp. 2419-2423.
Moon et al., "Application of interferometric broadband imaging alignment on an experimental x-ray stepper," *Journal of Vacuum Science and Technology*, B 16(6) (Nov./Dec. 1998), pp. 3631-3636.
Osburn et al., "Low parasitic resistance contacts for scaled ULSI devices," *Thin Solid Films*, 332 (1998), pp. 428-436.
Pfiester et al., "A Self-Aligned Elevated Source/Drain MOSFET," *IEEE Electron Device Letters*, vol. 11, No. 9 (Sep. 1990), pp. 365-367.
Raaijmakers et al., "Enabling technologies for forming and contacting shallow junctions in Si: HF-vapor cleaning and selective epitaxial growth of Si and SiGe," *Journal of Vacuum Science and Technology*, B 17(5) (Sep./Oct. 1999), pp. 2311-2320.
Robbins et al., "A model for heterogeneous growth of Sil-xGex films from hydrides," *Journal of Applied Physics*, 69 (6) (Mar. 15, 1991), pp. 3729-3732.

Rodder et al., "Raised Source/Drain MOSFET with Dual Sidewall Spacers," *IEEE Electron Device Letters*, vol. 12, No. 3 (Mar. 1991), pp. 89-91.

Samavedam et al., "Elevated source drain devices using silicon selective epitaxial growth," *Journal of Vacuum Science and Technology*, B 18(3) (May/Jun. 2000), pp. 1244-1250.

Savina et al., "Faceting of a growing crystal surface by surface diffusion," *Physical Review*, E 67, 021606 (2003), pp. 1-16.

Sedgwick et al., "Growth of Facet-Free Selective Silicon Epitaxy at Low Temperature and Atmospheric Pressure," *Journal of the Electrochemical Society*, vol. 138, No. 10 (Oct. 1991), pp. 3042-3047.

Sidek et al., "Reduction of parasitic bipolar transistor action and punchthrough susceptibility in MOSFETs using Si/Si1-xGex sources and drains," *Electronics Letters*, vol. 32, No. 3 (Feb. 1, 1996), pp. 269-270.

Sun et al., "A Comparative Study of n+/p Junction Formation for Deep Submicron Elevated Source/Drain Metal Oxide Semiconductor Field Effect Transistors," *Journal of the Electrochemical Society*, vol. 144, No. 10 (Oct. 1997), pp. 3659-3664.

Sun et al., "The Effect of the Elevated Source/Drain Doping Profile on Performance and Reliability of Deep Submicron MOSFET's," *IEEE Transactions on Electron Devices*, vol. 44, No. 9 (Sep. 1997), pp. 1491-1498.

Sun et al., "Impact of Epi Facets on Deep Submicron Elevated Source/Drain MOSFET Characteristics," *IEEE Transactions on Electron Devices*, vol. 45, No. 6 (Jun. 1998), pp. 1377-1380.

Tromp et al., "Local Dimer Exchange in Surfactant-Mediated Epitaxial Growth," *Physical Review Letters*, vol. 68, No. 7 (Feb. 17, 1992), pp. 954-957.

Uhrberg et al., "Electronic and atomic structure of arsenic terminated Si(100)," *Journal of Vacuum Science and Technology*, A 4 (3) (May/Jun. 1986), pp. 1259-1264.

Violette et al., "Facet-Free Selective Silicon Epitaxy by Reduced-Pressure Chemical Vapor Deposition: Process Evaluation and Impact on Shallow Trench Isolation," *Journal of the Electrochemical Society*, 146 (5) (1999), pp. 1895-1902.

Wong et al., "Elevated Source/Drain MOSFET," *IEDM Technical Digest*, 28 (1984), pp. 634-637.

Xiang et al., "Interfacet mass transport and facet evolution in selective epitaxial growth of Si by gas source molecular beam epitaxy," *Journal of Vacuum Science and Technology*, B 14(3) (May/Jun. 1996), pp. 2381-2386.

Yu et al., "Doping reaction of PH3 and B2H6 with Si(100)," *Journal of Applied Physics*, 59 (12) (Jun. 15, 1986) pp. 4032-4037.

International Search Report for PCT/US03/18140, Nov. 5, 2003.

Yew, "Growth and Characterization of Low Temperature Silicon Selective Epitaxy," Ph.D. Thesis, MIT, 1990, pp. 1-210.

Kurosawa et al., "A New Bird's Beak Free Field Isolation Technology for VLSI Devices," *IEDM Technical Digest*, Washington, D.C., Dec. 7-9, 1981, pp. 384-387.

Aldrich et al., "Stability of C54 Titanium Germanosilicide on a Silicon-Germanium Alloy Substrate," *J. Appl. Phys.*, 1995, 77(10):5107-5114.

Aubry-Fortuna et al., "Phase Formation and Strain Relaxation During Thermal Reaction of Zr and Ti with Strained $Si_{1-x-y}Ge_xC_y$ epilayers," *Journal of Applied Physics*, 2000, 88(3):1418-1423.

Detavernier, et al., "$CoSi_2$ Nucleation in the presence of Ge," *Thin Solid Films*, 2001, 384(2):243-250.

Eberhardt et al., "Ni/Ag Metallization for SiGE HBTs using a Ni Silicide Contact," *Semicond. Sci. Technol.*, 2001 16(9):L47-L49.

Freiman et al., "Kinetics of Processes in the $Ti-Si_{1-x}Ge_x$ Systems" *Appl. Phys. Lett.*, 1996, 69(25):3821-3823.

Freiman et al., "Titanium Metallization of Si/Ge Alloys and Superlattices," *Thin Solid Films*, 1997, 294:217-219.

Hsiao et al., "Advanced Technologies for Optimized Sub-Quarter-Micrometer SOI CMOS Devices," *IEEE Transactions on Electron Devices*, 1998, 45(5):1092-1098.

Huang et al., "Study on Ge/Si ratio, Silicidation, and Strain Relaxation of High Temperature Sputtered $Co/Si_{1-x}Ge_x$ Structures," *Journal of Applied Physics*, 2000, 88(4):1831-1837.

Jungemann et al., "Full-Band Monte Carlo Simulation of a 0.12 µm-Si-PMOSFET with and without Strained SiGe-Channel", *IEEE Electron Devices Meeting*, 1998, pp. 897-900.

King et al., "A Polycrystalline $Si_{1-x}Ge_x$-Gate CMOS Technology", *IEEE*, Volume, No., 1990, pp. 253-256.

Ku et al., "High Performance pMOSFETs with $Ni(Si_xGe_{1-x})$/Poly-$Si_{0.8}Ge_{0.2}$ Gate," *IEEE—2000 Symposium on VLSI Technology Digest of Technical Papers*, 2000, 114-115.

Lai et al., "Effects of Composition on the Formation Temperatures and Electrical Resistivities of C54 Titanium Germanosilicide in $Ti-Si_{1-x}Ge_x$ Systems," 1999, *Journal of Applied Physics*, 86(3):1340-1345.

Okada et al., "Epitaxial Growth of Heavily B-Doped SiGe Films and Interfacial Reaction of Ti/B-Doped SiGe Bilayer Structure Using Rapid Therma Processing," *Thin Solid Films*, 2000, 369:130-133.

Qin et al., "Structure and Thermal Stability of $Ni/Si_{1-x}Ge_x$ Contacts for VLSI Applications," *Electronics Letters*, 2000, 36(21):1819-1821.

Ponomarev et al., "High-Performance Deep SubMicron CMOS Technologies with Polycrystalline-SiGe Gates," *IEEE Transactions on Electron Devices*, vol. 47, No. 4, Apr. 2000, pp. 848-855.

Yasuda et al., "Interfacial Reactions of Ti/ and $Zr/Si_{1-x}Ge_x/Si$ Contacts with Rapid Thermal Annealing," *Thin Solid Films*, 2000, 373:73-78.

O'Neill et al., "Si-Ge Virtual Substrate N-channel Heterojunction MOSFETs", *Semiconductor Science Technology*, vol. 14, No. 9, 1999, pp. 784-789.

Gannavararn, et al., "Low Temperature ($\leq 800°$ C.) Recessed Junction Selective Silicon-Germanium Source/Drain Technology for sub-70 nm CMOS," *IEEE International Electron Device Meeting Technical Digest*, (2000), pp. 437-440.

Ge et al., "Process-Strained Si (PSS) CMOS Technology Featuring 3D Strain Engineering," *IEEE International Electron Devices Meeting Technical Digest*, (2003) pp. 73-76.

Ghani et al., "A 90nm High Volume Manufacturing Logic Technology Featuring Novel 45nm Gate Length Strained Silicon CMOS Transistors," *IEEE International Electron Devices Meeting Technical Digest*, (2003), 978-980.

Hamada et al., "A New Aspect of Mechanical Stress Effects in Scaled MOS Devices," *IEEE Transactions on Electron Devices*, vol. 38, No. 4 (Apr. 1991), pp. 895-900.

Huang et al., "Isolation Process Dependence of Channel Mobility in Thin-Film SOI Devices," *IEEE Electron Device Letters*, vol. 17, No. 6 (Jun. 1996), pp. 291-293.

Huang et al., "LOCOS-Induced Stress Effects on Thin-Film SOI Devices," *IEEE Transactions on Electron Devices*, vol. 44, No. 4 (Apr. 1997), pp. 646-650.

Huang, et al., "Reduction of Source/Drain Series Resistance and Its Impact on Device Performance for PMOS Transistors with Raised $Si_{1-x}Ge_x$ Source/Drain", *IEEE Electron Device Letters*, vol. 21, No. 9, (Sep. 2000) pp. 448-450.

Iida et al., "Thermal behavior of residual strain in silicon-on-insulator bonded wafer and effects on electron mobility," *Solid-State Electronics*, vol. 43 (1999), pp. 1117-1120.

Ito et al., "Mechanical Stress Effect on Etch-Stop Nitride and its Impact on Deep Submicron Transistor Design," *IEEE International Electron Devices Meeting Technical Digest*, (2000), pp. 247-250.

Lochtefeld et al., "Investigating the Relationship Between Electron Mobility and Velocity in Deeply Scaled NMOS via Mechanical Stress," *IEEE Electron Device Letters*, vol. 22, No. 12 (2001), pp. 591-593.

Ootsuka et al., "A Highly Dense, High-Performance 130nm node CMOS Technology for Large Scale System-on-a-Chip Applications," *IEEE International Electron Devices Meeting Technical Digest*, (2000), pp. 575-578.

Ota et al., "Novel Locally Strained Channel Technique for High Performance 55nm CMOS," *IEEE International Electron Devices Meeting Technical Digest*, (2002), pp. 27-30.

Öztürk, et al., "Advanced $Si_{1-x}Ge_x$ Source/Drain and Contact Technologies for Sub-70 nm CMOS," *IEEE International Electron Device Meeting Technical Digest*, (2002), pp. 375-378.

Öztürk, et al., "Low Resistivity Nickel Germanosilicide Contacts to Ultra-Shallow $Si_{1-x}Ge_x$ Source/Drain Junctions for Nanoscale CMOS," *IEEE International Electron Device Meeting Technical Digest* (2003), pp. 497-500.

Öztürk, et al., "Selective Silicon-Gremanium Source/Drain Technology for Nanoscale CMOS," *Mat. Res. Soc. Symp. Proc.*, vol. 717, (2002), pp. C4.1.1-C4.1.12.

Öztürk, et al., "Ultra-Shallow Source/Drain Junctions for Nanoscale CMOS Using Selective Silicon-Germanium Technology," *Extended Abstracts of International Workshop on Junction Technology*, (2001), pp. 77-82.

Shimizu et al., "Local Mechanical-Stress Control (LMC): A New Technique for CMOS-Performance Enhancement," *IEEE International Electron Devices Meeting Technical Digest*, (2001), pp. 433-436.

Thompson et al., "A Logic Nanotechnology Featuring Strained-Silicon," *IEEE Electron Device Letters*, vol. 25, No. 4 (Apr. 2004), pp. 191-193.

Thompson et al., "A 90 nm Logic Technology Featuring 50nm Strained-Silicon Channel Transistors, 7 layers of Cu *Interconnects*, Low k ILD, and 1um$^2$ SRAM Cell," *IEEE International Electron Devices Meeting Technical Digest*, (2002), pp. 61-64.

Tiwari et al., "Hole Mobility Improvement in Silicon-on-Insulator and Bulk Silicon Transistors Using Local Strain," *IEEE International Electron Devices Meeting Technical Digest*, (1997), pp. 939-941.

Uchino, et at., "A Raised Source/Drain Technology Using In-situ P-doped SiGe and B-doped Si for 0.1-μm CMOS ULSIs," *IEEE International Electron Device Meeting Technical Digest*, (1997), pp. 479-482.

Armstrong, "Technology for SiGe Heterostructure-Based CMOS Devices," Ph.D. Thesis, Massachusetts Institute of Technology, Department of Electrical Engineering and Computer Science (Jun. 30, 1999).

Armstrong et al., "Design of Si/SiGe Heterojunction Complementary Metal-Oxide-Semiconductor Transistors," IEDM Technical Digest (1995 International Electron Devices Meeting), pp. 761-764.

Augusto et al., "Proposal for a New Process Flow for the Fabrication of Silicon-based Complementary MOD-MOSFETs without ion Implantation," Thin Solid Films, vol. 294, No. 1-2, pp. 254-257 (Feb. 15, 1997).

Barradas et al., "RBS analysis of MBE-grown SiGe/(001) Si heterostructures with thin, high Ge content SiGe channels for HMOS transistors," Modern Physics Letters B, 2001 (abstract).

Borenstein et al., "A New Ultra-Hard Etch-Stop Layer for High Precision Micromachining," Proceedings of the 1999 12th IEEE International Conference on Micro Electro Mechanical Systems (MEMs) (Jan. 17-21, 1999), pp. 205-210.

Bouillon et al., "Search for the optimal channel architecture for 0.18/0.12 μm bulk CMOS experimental study," IEEE, (1996), pp. 21.2.1-21.2.4.

Bruel et al., "® SMART CUT: A Promising New SOI Material Technology," Proceedings of the 1995 IEEE International SOI Conference (Oct. 1995), pp. 178-179.

Bruel, "Silicon on Insulator Material Technology," Electronic Letters, vol. 31, No. 14 (Jul. 6, 1995), pp. 1201-1202.

Bufler et al., "Hole transport in strained $Si_{1-x}Ge_x$ alloys on $Si_{1-y}Ge_y$ substrates," Journal of Applied Physics, vol. 84, No. 10 (Nov. 15, 1998), pp. 5597-5602.

Burghartz et al., "Microwave Inductors and Capacitors in Standard Multilevel Interconnect Silicon Technology," IEEE Transactions on Microwave Theory and Techniques, vol. 44, No. 1 (Jan. 1996), pp. 100-104.

Canaperi et al., "Preparation of a relaxed Si—Ge layer on an insulator in fabricating high-speed semiconductor devices with strained epitaxial films," Intern. Business Machines Corporation, USA, 2002 (abstract).

Carlin et al, "High Efficiency GaAs-on-Si Solar Cells with High Voc Using Graded GeSi Buffers," IEEE (2000), pp. 1006-1011.

Chang et al., "Selective Etching of SiGe/Si Heterostructures," Journal of the Electrochemical Society, No. 1 (Jan. 1991), pp. 202-204.

Cheng et al., "Electron Mobility Enhancement in Strained-Si n-MOSFETs Fabricated on SiGe-on-Insulator (SGOI) Substrates," IEEE Electron Device Letters, vol. 22, No. 7 (Jul. 2001), pp. 321-323.

Cheng et al., "Relaxed Silicon-Germanium on Insulator Substrate by Layer Transfer," Journal of Electronic Materials, vol. 30, No. 12 (2001), pp. L37-L39.

Cullis et al., "Growth ripples upon strained SiGe epitaxial layers on Si and misfit dislocation interactions," Journal of Vacuum Science and Technology A, vol. 12, No. 4 (Jul./Aug. 1994), pp. 1924-1931.

Currie et al., "Carrier mobilities and process stability of strained Si n- and p-MOSFETs on SiGe virtual substrates," Journal of Vacuum Science and Technology B, vol. 19, No. 6 (Nov./Dec. 2001), pp. 2268-2279.

Currie et al., "Controlling Threading Dislocation in Ge on Si Using Graded SiGe Layers and Chemical-Mechanical Polishing," Applied Physics Letters, vol. 72, No. 14 (Feb. 1998), pp. 1718-1720.

Eaglesham et al., "Dislocation-Free Stranski-Krastanow Growth of Ge on Si( 100)," Physical Review Letters, vol. 64, No. 16 (Apr. 16, 1990), pp. 1943-1946.

Feijoo et al., "Epitaxial Si-Ge Etch Stop Layers with Ethylene Diamine Pyrocatechol for Bonded and Etchback Silicon-on-Insulator," Journal of Electronic Materials, vol. 23, No. 6 (Jun. 1994), pp. 493-496.

Fischetti et al., "Band structure, deformation potentials, and carrier mobility in strained Si, Ge, and SiGe alloys," Journal of Applied Physics, vol. 80, No. 4 (Aug. 15, 1996), pp. 2234-2252.

Fischetti, "Long-range Coulomb interactions in small Si devices. Part II. Effective electronmobility in thin-oxide structures," Journal of Applied Physics, vol. 89, No. 2 (Jan. 15, 2001), pp. 1232-1250.

Fitzgerald et al., "Dislocation dynamics in relaxed graded composition semiconductors," Materials Science and Engineering, B67 (1999), pp. 53-61.

Fitzgerald et al., "Relaxed $Ge_xSi_{1-x}$ structures for III-V integration with Si and high mobility two-dimensional electron gases in Si," Journal of Vacuum Science and Technology, (Jul./Aug. 1992), pp. 1807-1819.

Fitzgerald et al., "Totally Relaxed $Ge_xSi_{1-x}$ Layers with Low Threading Dislocation Densities Grown on Si Substrates," Applied Physics Letters, vol. 59, No. 7 (Aug. 12, 1991), pp. 811-813.

Garone et al., "Silicon vapor phase epitaxial growth catalysis by the presence of germane," Applied Physics Letters, vol. 56, No. 13 (Mar. 26, 1990), pp. 1275-1277.

Godbey et al., (1990) "Fabrication of Bond and Etch-Back Silicon Insulator Using a Strained $SI_{0.7}GE_{0.3}$ Layer as an Etch Stop," Journal of the Electrical Society, vol. 137, No. 10 (Oct. 1990) pp. 3219-3223.

Gray et al., "Analysis and Design of Analog Integrated Circuits," John Wiley & Sons, 1984, pp. 605-632.

Grillot et al., "Acceptor diffusion and segregation in $(Al_xG_{31-x})_{0.5}In_{0.5}P$ heterostructures," Journal of Applied Physics, vol. 91, No. 8 (2002), pp. 4891-4899.

Grützmacher et al., "Ge segregation in SiGe/Si heterostructures and its dependence on deposition technique and growth atmosphere," Applied Physics Letters, vol. 63, No. 18 (Nov. 1, 1993), pp. 2531-2533.

Hackbarth et al, "Alternatives to Thick MBE-Grown Relaxed SiGe Buffers," Thin Solid Films, vol. 369, pp. 148-151 (2000).

Hackbarth et al., "Strain relieved SiGe buffers for Si-based heterostructure field-effect transistors," Journal of Crystal Growth, vol. 201/202 (1999), pp. 734-738.

Halsall et al., "Electron diffraction and Raman studies of the effect of substrate misorientation on ordering in the AlGaInP system," Journal of Applied Physics, vol. 85, No. 1 (1999), pp. 199-202.

Herzog et al., "SiGe-based FETs: Buffer Issues and Device Results," Thin Solid Films, vol. 380, No. 1-2, pp. 36-41 Dec. 12, 2000.

Höck et al., "Carrier mobilities in modulation doped $Si_{1-x}Ge_x$ heterostructures with respect to FET applications," Thin Solid Films, vol. 336 (1998), pp. 141-144.

Höck et al., "High hole mobility in $Si_{0.17}Ge_{0.83}$ channel metal-oxide-semiconductor field-effect transistors grown by plasma-enhanced chemical vapor deposition," Applied Physics Letters, vol. 76, No. 26 (Jun. 26, 2000), pp. 3920-3922.

Höck et al., "High performance 0.25 μm p-type Ge/SiGe MODFETs," Electronics Letters, vol. 34, No. 19 (Sep. 17, 1998), pp. 1888-1889.

Hsu et al., "Surface morphology of related $Ge_xSi_{1-x}$ films," Appl. Phys. Lett., vol. 61, No. 11 (1992), pp. 1293-1295.

Huang et al., (2001) "Carrier Mobility enhancement in strained Si-on-insulatoir fabricated by wafer bonding", 2001 Symposium on VLSI Technology, Digest of Technical Papers, pp. 57-58.

Huang et al., "High-quality strain-relaxed SiGe alloy grown on implanted silicon-on-insulator substrate," Applied Physics Letters, vol. 76, No. 19 (May 8, 2000), pp. 2680-2682.

Huang et al., "The Impact of Scaling Down to Deep Submicron on CMOS RF Circuits," IEEE Journal of Solid-State Circuits, vol. 33, No. 7 (Jul. 1998), pp. 1023-1036.

IBM Technical Disclosure Bulletin, "Optimal Growth Technique and Structure for Strain Relaxation of Si—Ge Layers on Si Substrates," vol. 32, No. 8A (Jan. 1990), pp. 330-331.

IBM Technical Disclosure Bulletin, "2 Bit/Cell EEPROM Cell Using Band to Band Tunneling for Data Read-Out," vol. 35, No. 4B (Sep. 1992), pp. 136-140.

Ishikawa et al., "Creation of Si—Ge-based SIMOX structures by low energy oxygen implantation," Proceedings of the 1997 IEEE International SOI Conference (Oct. 1997), pp. 16-17.

Ishikawa et al., "SiGe-on-insulator substrate using SiGe alloy grown Si(001)," Applied Physics Letters, vol. 75, No. 7 (Aug. 16, 1999), pp. 983-985.

Kearney et al., "The effect of alloy scattering on the mobility of holes in a $Si_{1-x}Ge_x$ quantum well," Semiconductor Science and Technology, vol. 13 (1998), pp. 174-180.

Kim et al., "A Fully Integrated 1.9-GHz CMOS Low-Noise Amplifier," IEEE Microwave and Guided Wave Letters, vol. 8, No. 8 (Aug. 1998), pp. 293-295.

Koester et al., "Extremely High Transconductance $Ge/Si_{0.4}Ge_{0.6}$ p-MODFET's Grown by UHV-CVD," IEEE Electron Device Letters, vol. 21, No. 3 (Mar. 2000), pp. 110-112.

Konig et al., "Design Rules for N-Type SiGe Hetero FETs," Solid State Electronics, vol. 41, No. 10, pp. 1541-1547 Oct. 1, 1997.

König et al., "p-Type Ge-Channel MODFET's with High Transconductance Grown on Si Substrates," IEEE Electron Device Letters, vol. 14, No. 4 (Apr. 1993), pp. 205-207.

König et al., "SiGe HBTs and HFETs," Solid-State Electronics, vol. 38, No. 9 (1995), pp. 1595-1602.

Kuznetsov et al., "Technology for high-performance n-channel SiGe modulation-doped field-effect transistors," J. Vac. Sci. Technol., B 13(6), pp. 2892-2896 (Nov./Dec. 1995).

Langdo et al., (2002) "Preparation of Novel SiGe-free Strained Si on Insulator Substrates" IEEE International SOI Conference, pp. 211-212 (XP002263057).

Larson, "Integrated Circuit Technology Options for RFIC's—Present Status and Future Directions," IEEE Journal of Solid-State Circuits, vol. 33, No. 3 (Mar. 1998), pp. 387-399.

Lee et al., "CMOS RF Integrated Circuits at 5 GHz and Beyond," Proceedings of the IEEE, vol. 88, No. 10 (Oct. 2000), pp. 1560-1571.

Lee et al., "Strained Ge channel p-type metal-oxide-semiconductor field-effect transistors grown on $Si_{1-x}Ge_x/Si$ virtual substrates," Applied Physics Letters, vol. 79, No. 20 (Nov. 12, 2001), pp. 3344-3346.

Lee et al., "Strained Ge channel p-type MOSFETs fabricated on $Si_{1-x}Ge_x/Si$ virtual substrates," Material Research Society Symposium Proceedings, vol. 686 (2002), pp. A1.9.1-A1.9.5.

Leitz et al., "Channel Engineering of SiGe-Based Heterostructures for High Mobility MOSFETs," Material Research Society Symposium Proceedings, vol. 686 (2002), pp. A3.10.1-A3.10.6.

Leitz et al., "Dislocation glide and blocking kinetics in compositionally graded SiGe/Si," Journal of Applied Physics, vol. 90, No. 6 (Sep. 15, 2001), pp. 2730-2736.

Leitz et al., "Hole mobility enhancements in strained $Si/Si_{1-y}Ge_y$ p-type metal-oxide-semiconductor field-effect transistors grown on relaxed $Si_{1-x}Ge_x$ (x<y) virtual substrates," Applied Physics Letters, vol. 79, No. 25 (Dec. 17, 2001), pp. 4246-4248.

Li et al., "Design of high speed Si/SiGe heterojunction complementary metal-oxide-semiconductor field effect transistors with reduced short-channel effects," Vacuum Science and Technology A, vol. 20, No. 3 (May/Jun. 2002), pp. 1030-1033.

Lu et al., "High Performance 0.1 μm Gate-Length P-Type SiGe MODFET's and MOS-MODFET's," IEEE Transactions on Electron Devices, vol. 47, No. 8 (Aug. 2000), pp. 1645-1652.

Maszara, "Silicon-On-Insulator by Wafer Bonding: A Review," Journal of the Electrochemical Society, No. 1 (Jan. 1991), pp. 341-347.

Meyerson et al., "Cooperative Growth Phenomena in Silicon/Germanium Low-Temperature Epitaxy," Applied Physics Letters, vol. 53, No. 25 (Dec. 19, 1988), pp. 2555-2557.

Mizuno et al., "Advanced SOI-MOSFETs with Strained-Si Channel for High Speed CMOS-Electron/Hole Mobility Enhancement," Digest of Technical Papers, 2002 Symposium on VLSI Technology, Honolulu, Jun. 13-15, New York, NY, pp. 210-211.

Mizuno et al., "Electron and Hole Mobility Enhancement in Strained-Si MOSFET's on SiGe-on-Insulator Substrates Fabricated by SIMOX Technology," IEEE Electron Device Letters, vol. 21, No. 5 (May 2000), pp. 230-232.

Mizuno et al., "High Performance Strained-Si p-MOSFETs on SiGe-on-Insulator Substrates Fabricated by SIMOX Technology," IEEE IDEM Technical Digest, (1999 International Electron Device Meeting), pp. 934-936.

Nayak et al., "High-Mobility Strained-Si PMOSFET's," IEEE Transactions on Electron Devices, vol. 43, No. 10 (Oct. 1996), pp. 1709-1716.

Ota et al., "Application of heterojunction FET to power amplifier for cellular telephone," Electronic Letters, vol. 30, No. 11 (May 26, 1994), pp. 906-907.

Papananos, "Radio-Frequency Microelectronic Circuits for Telecommunication Applications," (1999), pp. 115-117, 188-193.

Parker et al., "SiGe Heterostructure CMOS Circuits and Applications", Solid-State Electronics, vol. 43, pp. 1497-1506 (1996).

Ransom et al., "Gate-Self-Aligned n-channel and p-channel Germanium MOSFET's," IEEE Transactions on Electron Devices, vol. 38, No. 12 (Dec. 1991), p. 2695.

Reinking et al., "Fabrication of high-mobility Ge p-channel MOSFETs on Si substrates," Electronics Letters, vol. 35, No. 6 (Mar. 18, 1999), pp. 503-504.

Rim, "Application of Silicon-Based Heterostructures to Enhanced Mobility Metal-Oxide-Semiconductor Field-Effect Transistors," Ph.D. Thesis, Stanford University, 1999, pp. 1-184.

Rim et al., "Enhanced Hole Mobilities in Surface-channel Strained-Si p-MOSFETs," IEEE, (1995), pp. 517-520.

Rim et al., "Fabrication and Analysis of Deep Submicron Strained-Si N-MOSFET's", IEEE Transactions on Electron Devices, vol. 47, No. 7, Jul. 2000, pp. 1406-1415.

Sadek et al., "Design of Si/SiGe Heterojunction Complementary Metal-Oxide-Semiconductor Transistors," IEEE Trans. Electron Devices, Aug. 1996, pp. 1224-1232.

Sakaguchi et al., "ELTRAN by splitting porous Si layers," Proceedings of the 195th Int. SOI Symposium, Electrochemical Society, vol. 99-3 (1999), pp. 117-121.

Schäffler, "High-Mobility Si and Ge Structures," Semiconductor Science and Technology, vol. 12 (1997), pp. 1515-1549.

Sugimoto et al., "A 2V, 500 MHz and 3V, 920 MHz Low-Power Current-Mode 0.6 μm CMOS VCO Circuit," Institute of Electronics, Information and Communication Engineers, vol. E82-C, No. 7 (Jul. 1999), pp. 1327-1329.

Ternent et al., "Metal Gate Strained Silicon MOSFETs for Microwave Integrated Circuits," IEEE (Oct. 2000), pp. 38-43.

Tsang et al., "Measurements of alloy composition and strain in thin $Ge_xSi_{1-x}$ layers," Journal of Applied Physics, vol. 75, No. 12 (Jun. 15, 1994), pp. 8098-8108.

Tweet et al., "Factors determining the composition of strained GeSi layers grown with disilane and germane," Applied Physics Letters, vol. 65, No. 20 (Nov. 14, 1994), pp. 2579-2581.

Usami et al., "Spectroscopic study of Si-based quantum wells with neighboring confinement structure," Semicon. Sci. Technol., 1997 (abstract).

Welser et al., "Electron Mobility Enhancement in Strained-Si N-Type Metal-Oxide-Semiconductor Field-Effect Transistors," IEEE Electron Device Letters, vol. 15, No. 3 (Mar. 1994), pp. 100-102.

Welser et al., "Evidence of Real-Space Hot-Electron Transfer in High Mobility, Strained-Si Multilayer MOSFETs," IEDM, pp. 545-548 (1993).

Welser et al., "NMOS and PMOS Transistors Fabricated in Strained Silicon/Relaxed Silicon-Germanium Structures," IEEE, pp. 1000-1002 (1992).

Welser, "The application of strained-silicon/relaxed-silicon germanium heterostructures to metal-oxide-semiconductor field-effect transistors," Ph.D. Thesis, Stanford University Dept. of Electrical Engineering, 1995.

Wolf and Tauber, "Silicon Processing for the VLSI Era vol. 1: Process Technology," Lattice Press, Sunset Beach, CA, 1986, pp. 384-386.

Xie et al., "Semiconductor Surface Roughness: Dependence on Sign and Magnitude of Bulk Strain," Physical Review Letters, vol. 73, No. 22 (Nov. 28, 1994), pp. 3006-3009.

Xie et al., "Very high mobility two-dimensional hole gas in Si/$Ge_xSi_{1-x}$/Ge structures grown by molecular beam epitaxy," Applied Physics Letters, vol. 63, No. 16 (Oct. 18, 1993), pp. 2263-2264.

Xie, "SiGe field effect transistors," Materials Science and Engineering, vol. 25 (1999), pp. 89-121.

Yamagata et al., "Bonding, Splitting and Thinning by Porous Si in ELTRAN; SOI- Epi Wafer," Material Research Society Symposium Proceedings, vol. 681E (2001), pp. 18.2.1-18.2.10.

Yeo et al., "Nanoscale Ultra-Thin-Body Silicon-on-Insulator P-MOSFET with a SiGe/Si Heterostructure Channel," IEEE Electron Device Letters, vol. 21, No. 4 (Apr. 2000), pp. 161-163.

Zhang et al., "Demonstration of a GaAs-Based Compliant Substrate Using Wafer Bonding and Substrate Removal Techniques," IEEE, (1998), pp. 25-28.

Ismail et al., "Modulation-doped n-type Si/SiGe with Inverted Interface," *Applied Physics Letters*, 65(10):1248-1250 (Sep. 5, 1994).

Ismail, "Si/SiGe High-Speed Field-Effect Transistors," International Electron Devices Meeting, Washington, D.C. (Dec. 10, 1995), pp. 20.11-20.1.4.

Kearney et al., "The effect of alloy scattering on the mobility of holes in a $Si_{1-x}Ge_x$ quantum well," *Semiconductor Science and Technology*, 13:174-180 (1998).

Kim et al., "A Fully Integrated 1.9-GHz CMOS Low-Noise Amplifier," *IEEE Microwave and Guided Wave Letters*, 8(8):293-295 (Aug. 1998).

* cited by examiner

ELEVATED SOURCE AND DRAIN ELEMENTS FOR STRAINED-CHANNEL HETEROJUNTION FIELD-EFFECT TRANSISTORS

FIELD OF THE INVENTION

This invention generally pertains to semiconductor structures formed on strained layers.

BACKGROUND

Field-effect transistors (FETs) based on strained heterojunction channels have shown significant promise for increased drive current and higher frequency operation, in comparison to traditional FETs with relaxed silicon channels. Strained heterojunction channels are fabricated from materials such as silicon (Si), silicon-germanium (SiGe), germanium (Ge), etc. Forming high-quality electrical contacts is difficult when the source and drain regions of a FET include materials other than pure silicon. High quality contacts to silicon-based FETs are traditionally achieved through a silicide process, where a metal such as cobalt or titanium is alloyed with silicon to form the contact. This process is typically not as effective with semiconductor materials other than silicon. For example, a cobalt silicide contact formed to a source disposed in a strained Si layer and an underlying SiGe layer may form a high-resistivity compound in the SiGe layer, thereby compromising the functionality of the contact. More specifically, discrete regions of cobalt silicide may form in the SiGe layer, with Ge excluded from the cobalt silicide.

SUMMARY

An elevated source/drain process enables the formation of good contacts to source and drain regions of a FET formed in a strained channel, such as strained silicon. In an embodiment, a bottommost boundary of the metal-semiconductor alloy contact extends into the strained silicon portion of each of the source and drain regions. The metal-semiconductor alloy contact does not extend into an underlying relaxed layer that may contain elements not found in the strained silicon layer, such as Ge, thereby avoiding the formation of high-resistivity compounds. By extending the metal-semiconductor alloy only into the strained silicon portion, the area of the metal-semiconductor alloy interface with the strained silicon is increased, thereby reducing contact resistance.

In another embodiment, the bottommost boundary of the metal-semiconductor alloy is disposed in a raised semiconductor layer over the source and drain regions. The raised semiconductor layer is formed over a strained upper layer. If the raised semiconductor layer is silicon, it is therefore also at least partially strained. This strain increases carrier mobilities, thereby lowering the sheet resistance of the semiconductor layer. This strain also results in a reduced energy bandgap, thereby lowering the contact resistivity between the metal-semiconductor alloy and the raised semiconductor layer. The raised semiconductor layer may also be germanium, which has a smaller bandgap than relaxed or strained silicon. This material choice, therefore, promotes a low contact resistivity between the metal-semiconductor alloy and the raised semiconductor layer.

In an alternative embodiment, the metal-semiconductor alloy contact extends a minimal distance into an underlying relaxed layer. This minimal distance is such that the formation of structural inhomogeneities is avoided.

In an aspect, the invention features a semiconductor structure including a surface layer disposed over a substrate, the surface layer including strained silicon. A contact layer is disposed over at least a portion of the surface layer, with the contact layer including a metal-semiconductor alloy. A bottommost boundary of the contact layer is disposed above a bottommost boundary of the surface layer.

One or more of the following features may also be included. The bottommost boundary of the contact layer may share an interface with the surface layer. The interface may have a low contact resistivity, e.g., less than approximately $5 \times 10^{-7}$ $\Omega$-cm$^2$. The surface layer may have a low resistivity, e.g., less than approximately 0.001 ohm-cm.

The semiconductor structure may also include a semiconductor layer disposed over a portion of the surface layer, with the bottommost boundary of the contact layer sharing an interface with the semiconductor layer. The semiconductor layer may include an epitaxial layer, and generally includes at least one of germanium and silicon. The interface between the contact layer and the semiconductor layer may have a low contact resistivity. The contact layer may have a low sheet resistance, e.g., less than approximately 10 $\Omega$/□. The metal-semiconductor alloy may include a metal including at least one of cobalt, titanium, tungsten, nickel, and platinum. The metal-semiconductor alloy may include a semiconductor including at least one of silicon and germanium.

The semiconductor structure may also include a relaxed layer disposed under the surface layer. The relaxed layer may include at least one of germanium and silicon. The bottommost boundary of the contact layer may be disposed above the relaxed layer.

The semiconductor structure may also include a doped region in the surface layer, with the bottommost boundary of the contact layer being disposed above a bottommost boundary of the doped region. The doped region may include at least a portion of a transistor source and/or drain.

In another aspect, the invention features a semiconductor structure including a surface layer disposed over a substrate, the surface layer including strained silicon. A relaxed layer is disposed over the substrate, the relaxed layer being disposed underneath and proximate the surface layer. The relaxed layer and the surface layer generally share an interface. A contact layer is disposed over a portion of the surface layer, the contact layer including a metal-semiconductor alloy. A portion of the contact layer extends into the relaxed layer, a bottommost boundary of the contact layer shares an interface with the relaxed layer, and the interface between the contact layer and relaxed layer is a minimal distance from the interface between the surface layer and the relaxed layer, the minimal distance inhibiting formation of structural inhomogeneities. The minimal distance may be less than 50 Å.

In another aspect, the invention features a method for fabricating a semiconductor structure. The method includes providing a substrate having a surface layer disposed thereon, the surface layer including strained silicon; forming a semiconductor layer over a portion of the surface layer; depositing a metal over the semiconductor layer to form a metal layer; and heating the substrate to form an alloy including at least a portion of the semiconductor layer and at least a portion of the metal layer.

One or more of the following features may also be included. The semiconductor layer may include an epitaxial layer. The semiconductor layer may include at least one of silicon and germanium. The metal may include at least one of cobalt, titanium, tungsten, nickel, and platinum. The substrate may include a relaxed layer disposed underneath the surface layer, and the relaxed layer may include at least one of germanium and silicon.

A plurality of dopants may be introduced to form a doped region in the portion of the surface layer. The dopants may be introduced into the semiconductor layer. The doped region may include at least a portion of a transistor source and/or drain. The dopants may be introduced prior to depositing the metal.

A plurality of dopants may be introduced into the semiconductor layer. The dopants may be introduced prior to depositing the metal.

The substrate may include a sidewall spacer disposed on the surface layer and the semiconductor layer may be formed selectively with respect to the sidewall spacer. The substrate may include a gate electrode disposed on the surface layer and the semiconductor layer may be formed on a top surface of the gate electrode.

DETAILED DESCRIPTION

Figure 1A:
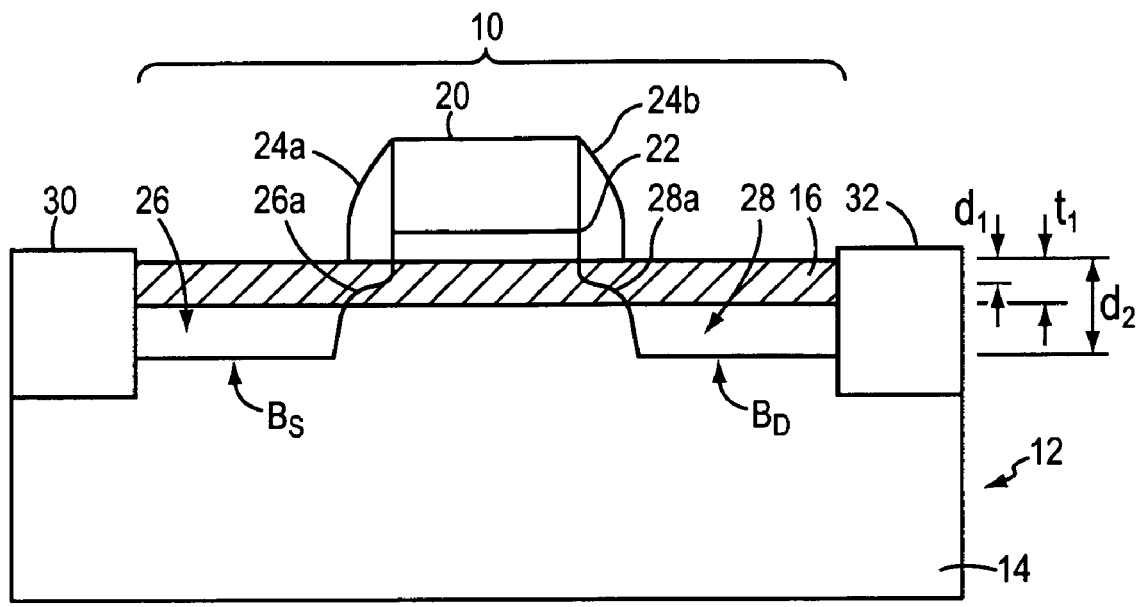
FIGS. 1-5 are schematic cross-sectional views of a semiconductor structure, illustrating a process for fabricating the structure.
Figure 1B:
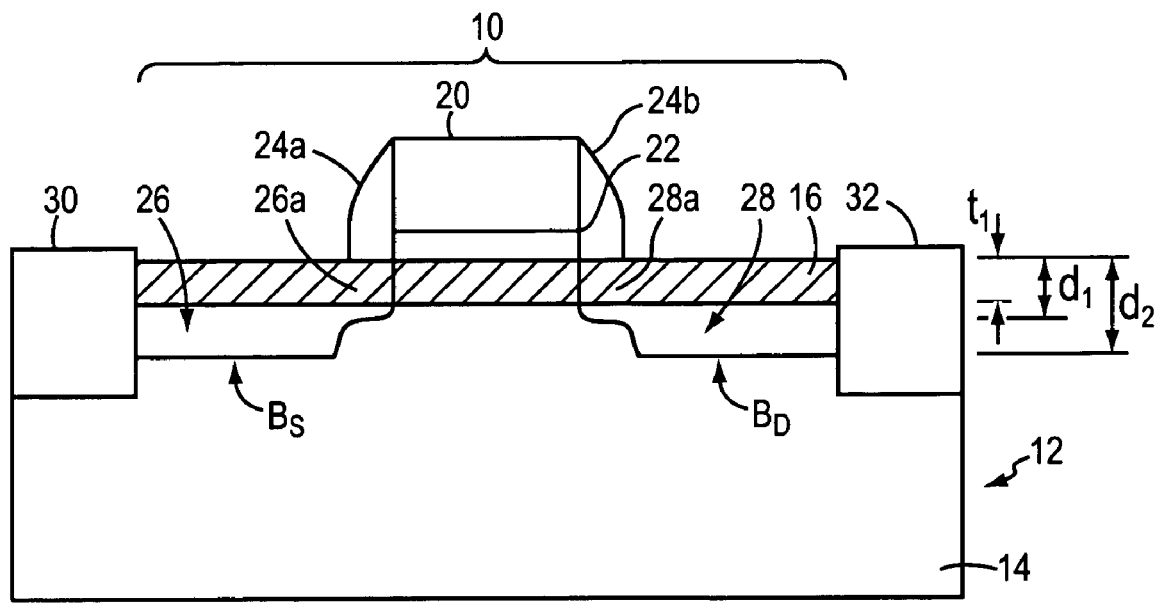

Referring to FIGS. 1a and 1b, a transistor 10 is formed on a substrate 12. Substrate 12 includes a relaxed layer 14, which has a lattice constant greater than that of silicon. Underlying layer 14 includes, for example, $Si_{0.80}Ge_{0.20}$ and has a lattice constant of 5.472 Å. Substrate 12 also has a surface layer 16, disposed over relaxed layer 14. Surface layer 16 includes strained silicon, has a thickness $t_1$ of, e.g., 200 Å, and has a low resistivity of, e.g., less then approximately 0.001 ohm-cm. A suitable substrate 12 with relaxed layer 14 and surface layer 16 can be readily obtained from, e.g., IQE Silicon Compounds, Ltd., UK.

Transistor 10 includes a gate 20 disposed over a gate dielectric 22. Gate 20 can be formed by, for example, depositing and patterning polysilicon, and gate dielectric 22 can be formed by, for example, growth of a gate oxide, such as silicon dioxide. A first and a second sidewall spacer 24a, 24b are formed proximate gate 20. Sidewall spacers 24a, 24b are formed of, e.g., silicon dioxide, silicon nitride, or a stack of both or other suitable materials. A source 26 and a drain 28, as indicated by the boundaries $B_s$ and $B_D$, are formed proximate gate 20 in substrate 12 by, for example, ion implantation. In an embodiment, transistor 10 is an NMOS transistor, and source 26 and drain 28 are formed by the implantation of n-type ions, such as arsenic. Source 26 and drain 28 may extend through surface layer 16 into relaxed layer 14. Source 26 has a source extension region 26a disposed under first sidewall spacer 24a, and drain 28 has a drain extension region 28a disposed under second sidewall spacer 24b. Source and drain extension regions 26a, 28a have a depth $d_1$ that is less than a depth $d_2$ of source 26 and drain 28. Extension region depth $d_1$ is, for example, 100-300 Å and source and drain depth $d_2$ is, for example, 400-1000 Å. Isolation regions 30, 32 separate transistor 10 from adjacent devices. Isolation regions 30, 32 are, for example, trenches filled with a dielectric material.

Figure 2:
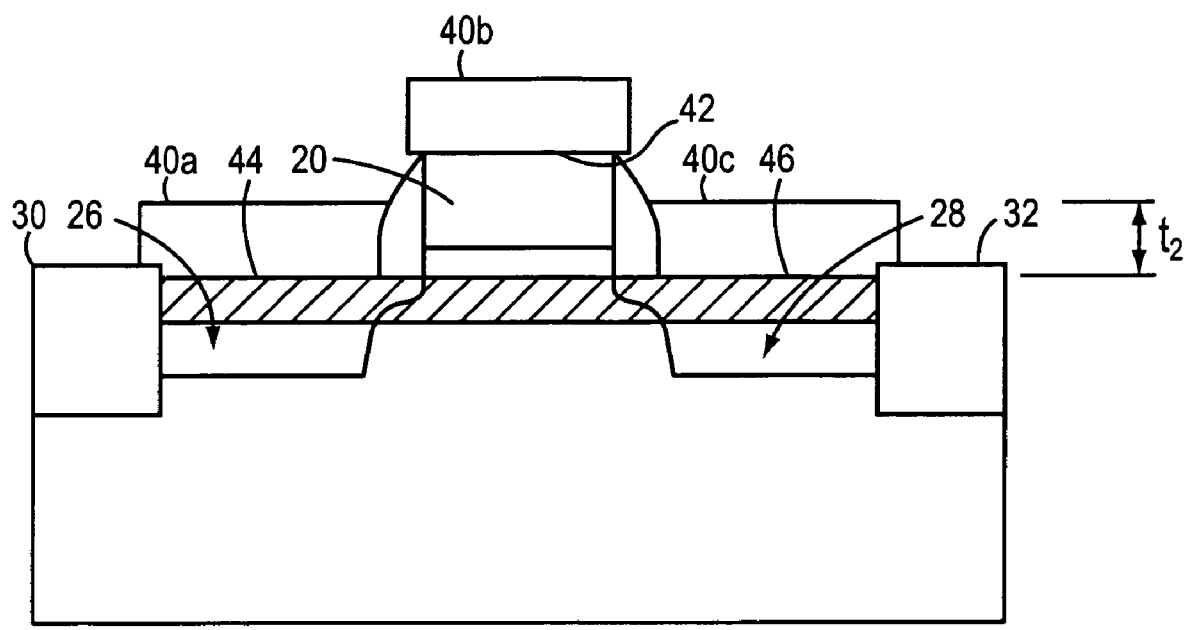

Referring to FIG. 2, a semiconductor layer 40a-40c is formed selectively on exposed silicon surfaces, i.e., on top surface 42 of polysilicon gate 20, top surface 44 of source 26, and top surface 46 of drain 28. In an embodiment, semiconductor layer 40a-40c is an epitaxial layer, such as epitaxial silicon. No semiconductor layer is formed on non-silicon features, such as sidewall spacers 24a, 24b and isolation regions 30, 32. Semiconductor layer 40a-40c has a thickness $t_2$ of, for example, approximately 100-300 Å. Semiconductor layer 40a-40c has a low resistivity of, e.g., 0.001 ohm-cm, that facilitates the formation of low-resistance contacts. To achieve this low resistivity, semiconductor layer 40a-40c is, for example, epitaxial silicon doped with, for example, arsenic to a concentration of $1 \times 10^{20}$ $cm^{-3}$. Semiconductor layer 40a-40c may be doped in situ, during deposition. In alternative embodiments, semiconductor layer 40a-40c may be doped after deposition by ion implantation or by gas-, plasma- or solid-source diffusion. In some embodiments, the doping of semiconductor layer 40a-40c and the formation of source 26 and drain 28 are performed simultaneously.

Figure 3:
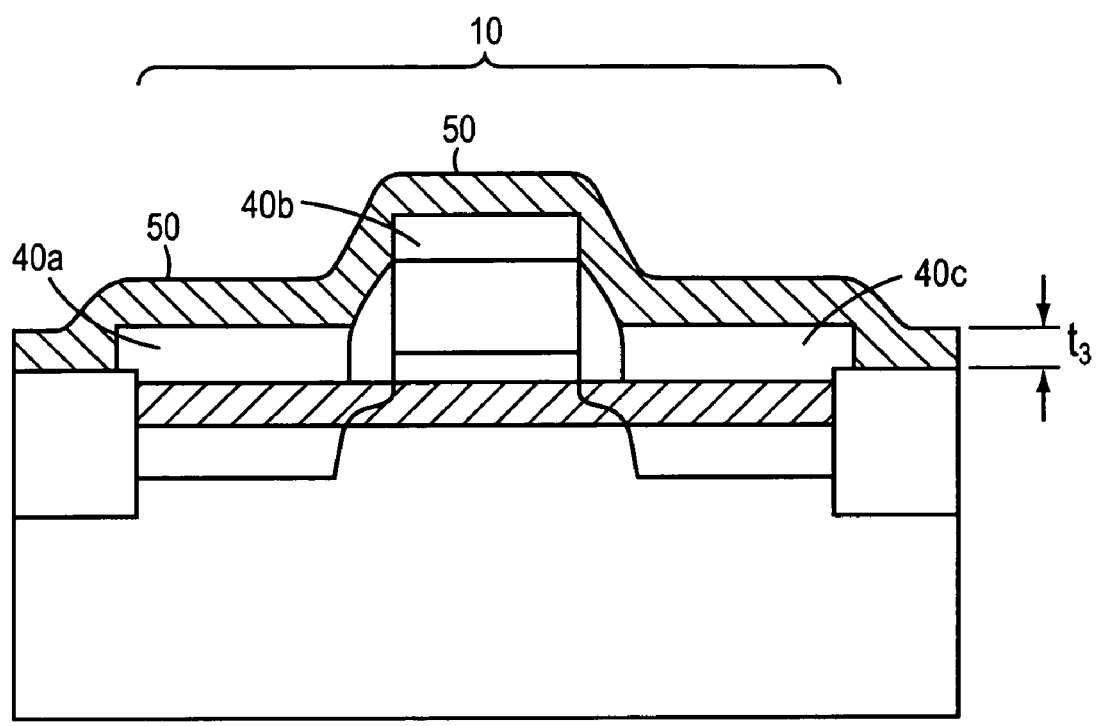

Referring to FIG. 3, a metal layer 50 is formed over transistor 10. Metal layer 50 is formed by, for example, sputter deposition. Metal layer 50 has a thickness $t_3$ of, e.g., 50-200 Å and includes a metal such as cobalt, titanium, tungsten, nickel, or platinum. The metal is selected to react with semiconductor layer 40a-40c to form a low-resistance metal-semiconductor alloy when exposed to heat, as described below. The metal is also selected such that the metal-semiconductor alloy remains stable at temperatures typically required to complete transistor 10 fabrication, e.g., 400-700° C.

Figure 4:
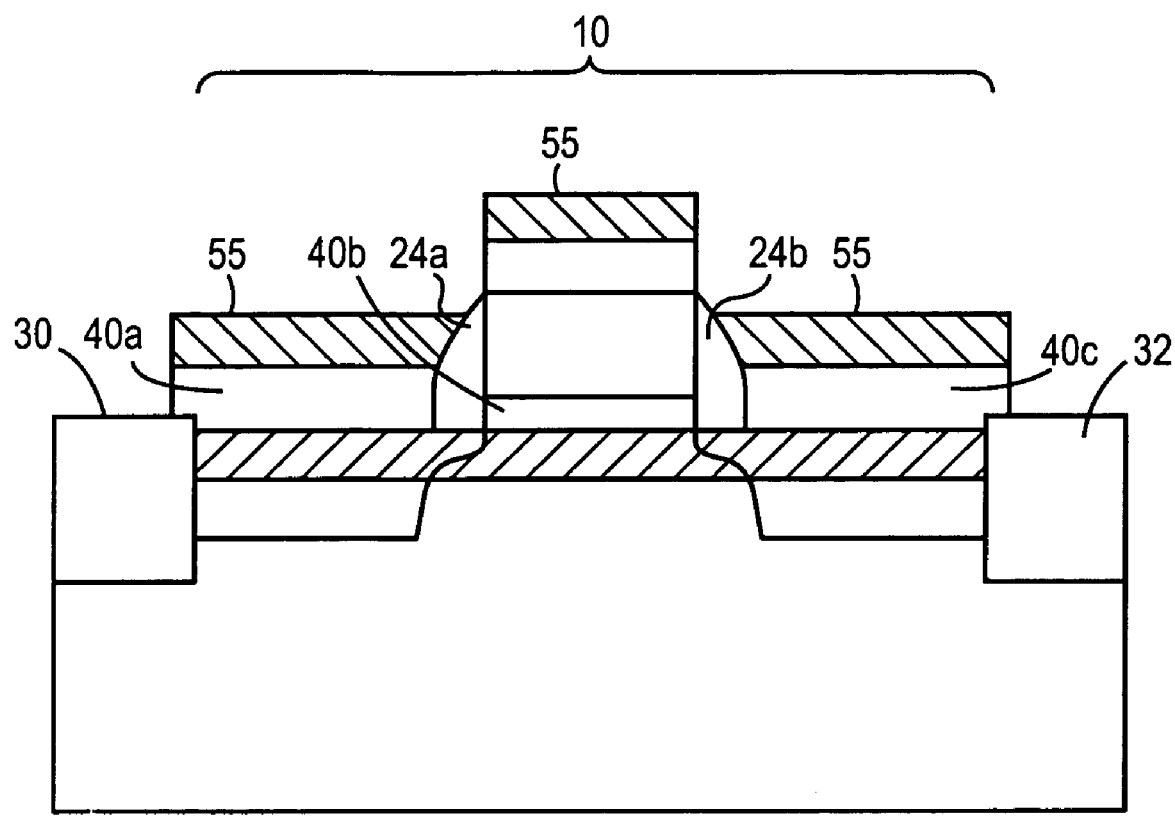

Referring also to FIG. 4, subsequent to deposition of metal layer 50, a first rapid thermal anneal is performed, e.g., at 550° C. for 60 seconds. This heating step initiates a reaction between metal layer 50 and semiconductor layers 40a-40c, forming a high resistivity phase of a metal-semiconductor alloy, e.g., cobalt silicide (CoSi). Portions of metal layer 50 are removed by a wet etch, such as sulfuric acid and hydrogen peroxide. In an alternative embodiment, the wet etch may be ammonium hydroxide, peroxide, and water. This wet etch removes portions of metal layer 50 disposed over dielectric material, such as over first and second sidewall spacers 24a, 24b and isolation regions 30, 32. Portions 55 of metal layer 50 disposed over semiconductor layer 40a-40c that have reacted to form the metal-semiconductor alloy remain in place after the anneal and wet etch.

Figure 5:
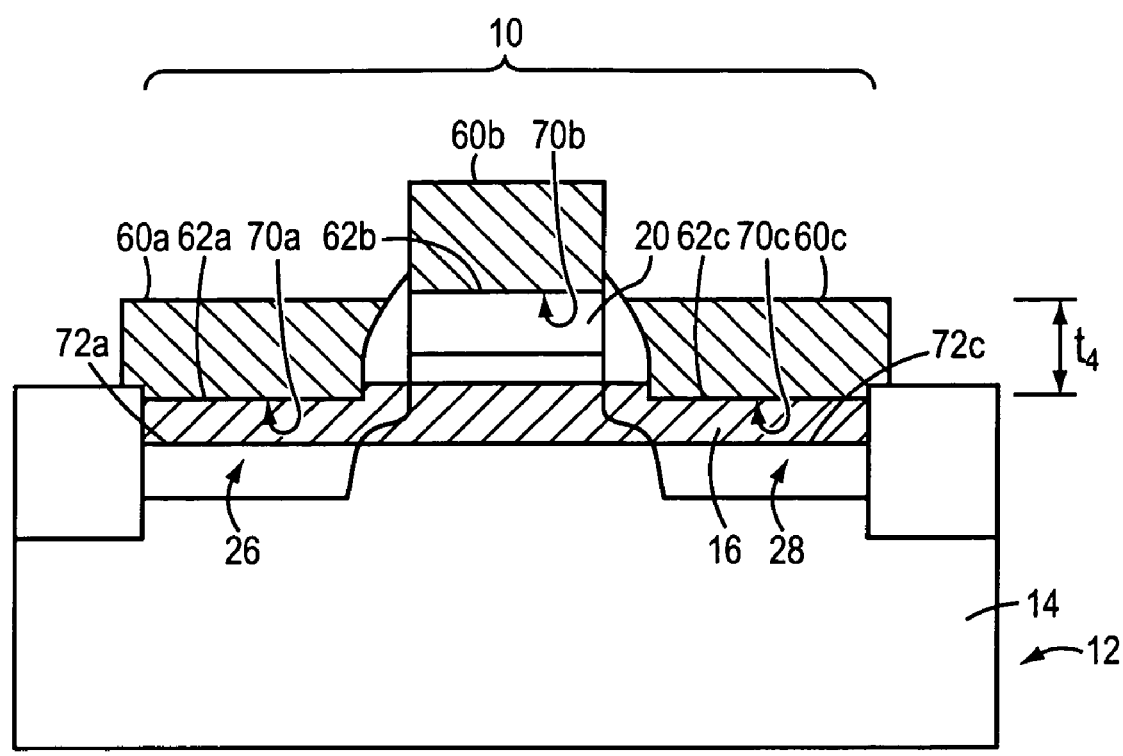

Referring to FIG. 5, substrate 12, including transistor 10, is subjected to a second heat treatment. For example, in an embodiment in which metal layer 50 includes cobalt, substrate 12 undergoes a rapid thermal anneal at 800° C. for 60 seconds in a nitrogen ambient. This heating step initiates a reaction in the metal-semiconductor alloy layer which substantially lowers its resistivity, to form a substantially homogeneous contact layer 60a-60c. Contact layer 60a-60c includes a metal-semiconductor alloy, e.g., a metal silicide such as a low resistivity phase of cobalt silicide ($CoSi_2$). Contact layer 60a-60c has a thickness $t_4$ of, for example, 400 Å. Contact layer 60a-60c has a low sheet resistance, e.g., less than about 10 Ω/□, and enables a good quality contact to be made to source 26 and drain 28, as well as to gate 20.

During formation, contact layer 60a-60c consumes substantially all of semiconductor layer 40a-40c. Moreover, contact layer portions 60a, 60c, disposed over source 26 and drain 28, extend into surface layer 16. A bottommost boundary 62a of contact layer 60a, therefore, shares an interface 70a with surface layer 16 in source 26, and a bottommost boundary 62c of contact layer 60c, therefore, shares an interface 70c with surface layer 16 in drain 28. A bottommost boundary 62b of contact layer 60b shares an interface 70b with gate 20. Interfaces 70a, 70c between contact layer 60a, 60c and surface layer 16 are disposed within source 26 and drain 28, respectively, above bottommost boundaries 72a, 72c of surface layer 16, and above relaxed layer 14, i.e. contact layer 60a, 60c does not extend into relaxed layer 14. Interfaces 70a, 70c have a low contact resistivity, e.g., less than approximately $5 \times 10^{-7}$ $\Omega$-cm$^2$. Because surface layer 16 includes strained silicon, carrier mobilities in surface layer 16 are enhanced, facilitating lower sheet resistances. This strain also results in a reduced energy bandgap, thereby lowering the contact resistivity between the metal-semiconductor alloy and the surface layer.

Figure 6:
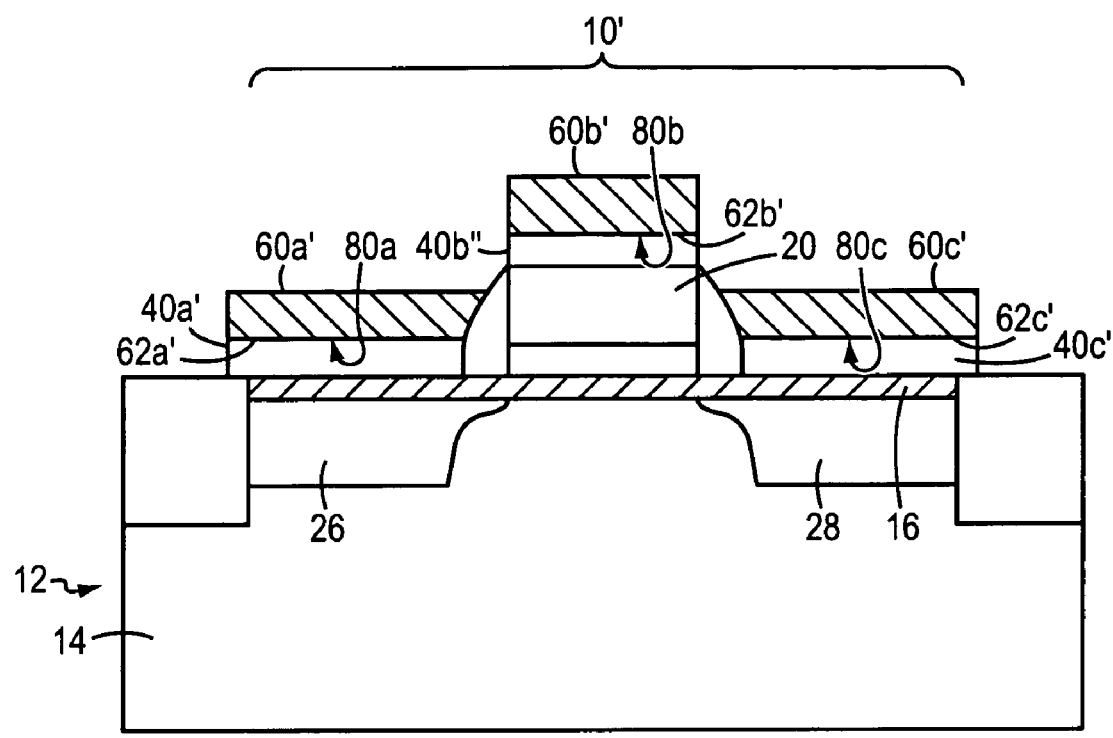
FIGS. 6-7 are schematic cross-sectional views of alternative embodiments of the semiconductor structure.

Referring to FIG. 6, in an alternative embodiment, formation of contact layer 60a'-60c' consumes only a portion of semiconductor layer 40a'-40c'. Here, as described with reference to FIGS. 1a and 1b, a transistor 10' is formed on substrate 12 having relaxed layer 14 and surface layer 16. Semiconductor layer 40a'-40c' is formed over surface layer 16 and gate 20, as described above with reference to FIG. 2. Semiconductor layer 40a'-40c' may be an epitaxial layer containing a semiconductor such as silicon, silicon germanium, or germanium. In this embodiment, semiconductor layer 40a'-40c' has a thicker starting thickness, e.g., 300-500 Å. Here, too, dopants are introduced into semiconductor layer 40a'-40c' prior to metal layer (not shown) formation to reduce the resistivity of semiconductor layer 40a'-40c'. In some embodiments, source 26 and drain 28 are formed simultaneously with the introduction of dopants into semiconductor layer 40a'-40c'. The metal layer is subsequently formed as described above with reference to FIG. 3. The metal layer may include cobalt, titanium, tungsten, nickel, or platinum. Contact layer 60a'-60c' is formed by annealing the metal layer and performing a wet etch, as described above with reference to FIG. 4. Contact layer 60a'-60c' includes a metal-semiconductor alloy. A bottommost boundary 62a' of contact layer 60a' shares an interface 80a with semiconductor layer 40a' over source 26, a bottommost boundary 62b' of contact layer 60b' shares an interface 80b with semiconductor layer 40b' over gate 20, and a bottommost boundary 62c' of contact layer 60c' shares an interface 80c with semiconductor layer 40c' over drain 28.

Contact resistance between contact layer 60a'-60c' and semiconductor layer 40a'-40c' is directly proportional to the bandgap of semiconductor layer 40a'-40c'. The bandgap of semiconductor layer 40a'-40c' depends on the material of which it is formed. Strained silicon has a lower bandgap than relaxed silicon, and pure germanium has an even lower bandgap. In an embodiment, semiconductor layer 40a'-40c' has a relatively high Ge content, e.g., 90-100%. The contact resistance between contact layer 60a'-60c' and semiconductor layer 40a'-40c' is therefore relatively low because the presence of Ge reduces the bandgap of contact layer 60a'-60c' in comparison to pure silicon. Further, the high concentration of germanium results in the contact layer 60a'-60c' having a high germanocide content with a uniform homogeneity.

Moreover, the sheet resistance of semiconductor layer 40a'-40c' is lowered if carrier mobilities in semiconductor layer 40a'-40c' are increased. Strained silicon has higher carrier mobilities, both for holes and electrons. Further, pure Ge, regardless of whether or not it is strained, has higher mobilities for both holes and electrons than even strained silicon. In embodiments in which semiconductor layer 40a'-40c' is an epitaxial layer including primarily Si, semiconductor layer 40a'-40c' has a relatively low sheet resistance because it is formed on surface layer 16 that is under tensile strain. Semiconductor layer 40a'-40c', therefore, is also under tensile strain. The tensile strain increases carrier mobilities, thereby lowering the sheet resistance of semiconductor layer 40a'-40c'. Furthermore, in embodiments in which the semiconductor layer 40a'-40c' is an epitaxial layer including primarily Ge, semiconductor layer 40a'-40c' has a relatively low sheet resistance because carrier mobilities are higher in Ge then in relaxed Si.

Figure 7:
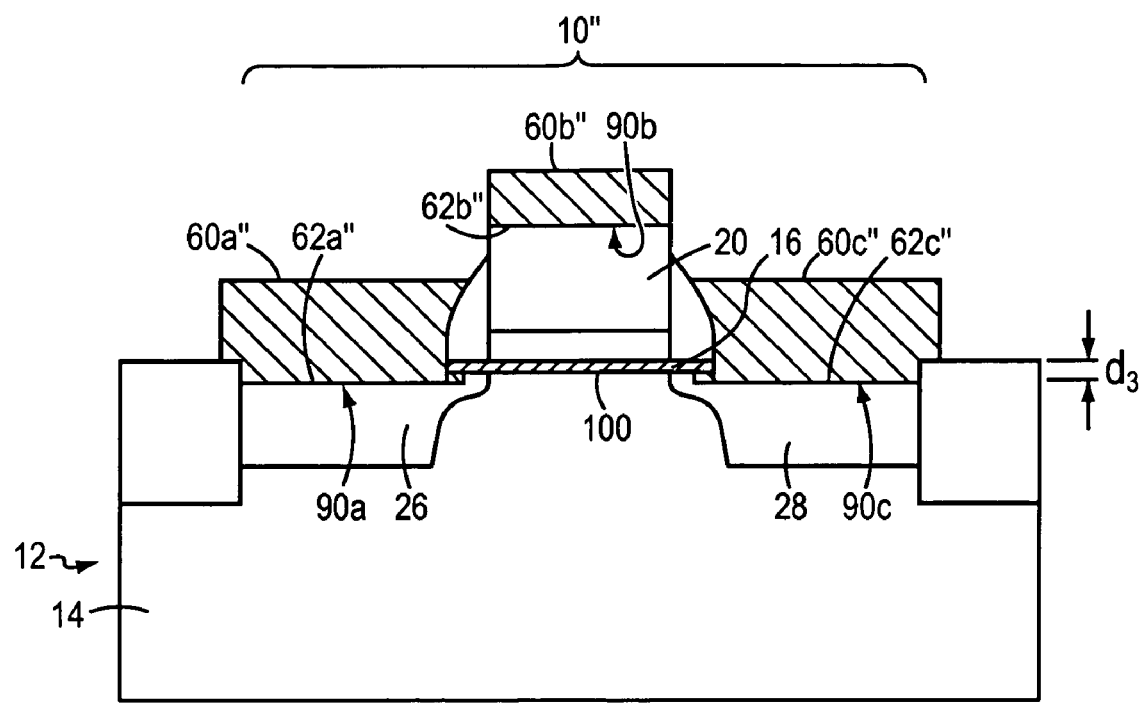

Referring to FIG. 7, contact layer 60a", 60c" extends through surface layer 16 and into underlying layer 14 within source 26 and drain 28, and contact layer 60b" extends into gate 20. Here, as described above with reference to FIGS. 1a and 1b, transistor 10" is formed in substrate 12 having relaxed layer 14 and surface layer 16. A semiconductor layer (not shown) is formed over surface layer 16 and gate 20, as described above with reference to FIG. 2. The semiconductor layer may be an epitaxial layer containing a semiconductor such as silicon, silicon germanium, or germanium. In this embodiment, the semiconductor layer has a starting thickness of, e.g., 100-300 Å. Here, too, dopants are introduced into the semiconductor layer prior to metal layer (not shown) formation to reduce the resistivity of the semiconductor layer. In some embodiments, source 26 and drain 28 are formed simultaneously with the introduction of dopants into the semiconductor layer. The metal layer is subsequently formed as described above with reference to FIG. 3. The metal layer may include cobalt, titanium, tungsten, nickel, or platinum. The metal layer is of a sufficient thickness and/or the semiconductor layer is sufficiently thin such that the subsequently formed metal-semiconductor alloy layer extends into underlying layer 14. Contact layer 60a"-60c" is formed by annealing the metal layer and performing a wet etch, as described above with reference to FIG. 4. Contact layer 60a"-60c" includes a metal-semiconductor alloy. A bottommost boundary 62a' of contact layer 60a" shares an interface 90a with underlying layer 14 in source 26, a bottommost boundary 62b" of contact layer 60b' shares an interface 90b with gate 20, and a bottommost boundary 62c" of contact layer 60c' shares an interface 90c with underlying layer 14 in drain 28. Contact layer 60a", 60c" extends a minimal distance $d_3$ into relaxed underlying layer 14 beyond an interface 100 between relaxed underlying layer 14 and surface layer 16. Structural inhomogeneities may occur, for example, when a metal reacts with a mixture of silicon and germanium, i.e. a metal silicide may form along with discrete regions of high-resistivity germanium. This inhomogeneity may be inhibited by minimizing the depth $d_3$ which contact layer 60a", 60c", formed of a metal-semiconductor alloy, extends into relaxed underlying layer 14 that may contain germanium. Mininimal distance $d_3$ is desirably the largest distance compatible with the inhibition of the formation of structural inhomogeneities. It is noted that structural inhomogeneities tend to form at a metal-semiconductor alloy extension into relaxed underlying layer 14 of approximately 50 Å. Minimal distance $d_3$ is, for example, less than 50 Å. The amount of metal that reacts with underlying layer 14 is thereby minimized and structural inhomogeneities are avoided.

In an alternative embodiment, the transistor is a PMOS transistor. Contact may made to a region other than a gate, a source, or a drain of a transistor, and the source and drain may be formed by introducing dopants through the alloy or prior to depositing the metal. The described structure may be formed on a semiconductor-on-insulator (SOI) substrate, with a buried insulator layer separating the surface layer from the semiconductor substrate. In some embodiments, the thickness of the surface semiconductor layer may be too thin to form a silicide. This feature, therefore, provides an additional motivation for elevating the source and drain prior to silicidation.

The epitaxial layer may be a semiconductor other then silicon. One possibility is to use germanium, which is easier to grow selectively then silicon, and may promote the formation of low-resistance contacts because of its relatively low bandgap. Another option is to use a stack of two or more semiconductor materials. For example, because germanium is known to be aggressively etched by various cleaning steps used in the semiconductor industry, the raised source/drain material could be a stack of germanium protected by a layer of silicon.

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A semiconductor structure comprising:

a surface layer disposed over a substrate, the surface layer comprising strained silicon; and a contact layer disposed over at least a portion of the surface layer, the contact layer comprising a metal-semiconductor alloy, the metal-semiconductor alloy consisting of a metal germanocide, wherein a bottommost boundary of the contact layer is disposed above a bottommost boundary of the surface layer.

* * * * *